US011053590B2

(12) United States Patent
Mishra et al.

(10) Patent No.: US 11,053,590 B2
(45) Date of Patent: Jul. 6, 2021

(54) NOZZLE FOR UNIFORM PLASMA PROCESSING

(71) Applicant: Applied Materials, Inc., Santa Clara, CA (US)

(72) Inventors: Rohit Mishra, Santa Clara, CA (US); Siva Suri Chandra Rao Bhesetti, Singapore (SG); Eng Sheng Peh, Singapore (SG); Sriskantharajah Thirunavukarasu, Singapore (SG); Shoju Vayyapron, Bangalore (IN); Cheng Sun, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 94 days.

(21) Appl. No.: 16/584,707

(22) Filed: Sep. 26, 2019

(65) Prior Publication Data

US 2020/0017972 A1 Jan. 16, 2020

Related U.S. Application Data

(62) Division of application No. 14/461,318, filed on Aug. 15, 2014, now Pat. No. 10,465,288.

(51) Int. Cl.
*H01J 37/32* (2006.01)
*C23C 16/50* (2006.01)
*C23C 16/455* (2006.01)

(52) U.S. Cl.
CPC ........ *C23C 16/50* (2013.01); *C23C 16/45565* (2013.01); *H01J 37/3244* (2013.01)

(58) Field of Classification Search
CPC . C23C 16/50; C23C 16/45565; H01J 37/3244
USPC ........................ 118/715; 156/345.33, 345.34
See application file for complete search history.

(56) References Cited

U.S. PATENT DOCUMENTS

| 3,592,575 A | * | 7/1971 | Jaeger | ..................... F23D 17/00 431/114 |
| 3,745,969 A | * | 7/1973 | Huffman | ............. C23C 16/4584 118/730 |
| 3,881,863 A | * | 5/1975 | Creuz | ..................... F23D 17/00 432/222 |

(Continued)

FOREIGN PATENT DOCUMENTS

| CN | 1850348 | 10/2006 |
| CN | 101589172 | 11/2009 |

(Continued)

OTHER PUBLICATIONS

Non-Final Office Action from U.S. Appl. No. 14/461,318, dated Feb. 16, 2017, 7 pgs.

(Continued)

*Primary Examiner* — Rudy Zervigon
(74) *Attorney, Agent, or Firm* — Schwabe, Williamson & Wyatt, P.C.

(57) ABSTRACT

A nozzle for uniform plasma processing comprises an inlet portion and an outlet portion. The inlet portion has a side surface substantially parallel to a vertical axis. The inlet portion comprises a plurality of gas channels. The outlet portion is coupled to the inlet portion. The outlet portion comprises a plurality of outlets. At least one of the outlets is at an angle other than a right angle relative to the vertical axis.

10 Claims, 10 Drawing Sheets

(56) References Cited

U.S. PATENT DOCUMENTS

| | | | | |
|---|---|---|---|---|
| 3,995,811 | A * | 12/1976 | Broderick | B05B 7/206 239/85 |
| 4,069,974 | A * | 1/1978 | Zawacki | B05B 14/10 239/706 |
| 4,080,927 | A * | 3/1978 | Brown | G21C 3/626 118/716 |
| 4,293,755 | A * | 10/1981 | Hill | C23C 16/4411 118/50.1 |
| 4,313,721 | A * | 2/1982 | Henriques | F23D 11/406 239/424.5 |
| 4,389,229 | A * | 6/1983 | Jang | B07B 7/02 118/692 |
| 4,439,401 | A * | 3/1984 | Voll | C09C 1/50 422/150 |
| 4,481,228 | A * | 11/1984 | Morel | B05B 5/08 118/626 |
| 4,730,775 | A * | 3/1988 | Maas | B05B 1/28 239/120 |
| 4,854,263 | A * | 8/1989 | Chang | C23C 16/345 118/715 |
| 5,002,928 | A * | 3/1991 | Fukui | B05B 17/0623 427/110 |
| 5,105,761 | A * | 4/1992 | Charlet | H01J 37/3244 118/719 |
| 5,134,965 | A * | 8/1992 | Tokuda | H01J 37/32247 118/723 MW |
| 5,169,509 | A * | 12/1992 | Latz | C23C 14/0063 204/298.03 |
| 5,232,164 | A * | 8/1993 | Resch | B05B 1/265 239/424 |
| 5,290,993 | A * | 3/1994 | Kaji | H01J 37/32192 156/345.42 |
| 5,297,738 | A * | 3/1994 | Lehr | B05B 1/3442 239/493 |
| 5,522,934 | A * | 6/1996 | Suzuki | C23C 16/455 118/723 AN |
| 5,547,714 | A * | 8/1996 | Huck | A61F 2/30767 427/523 |
| 5,556,521 | A * | 9/1996 | Ghanbari | H01J 37/321 118/723 I |
| 5,567,267 | A * | 10/1996 | Kazama | H01J 37/32 156/345.27 |
| 5,614,055 | A * | 3/1997 | Fairbairn | H01J 37/321 156/345.33 |
| 5,643,394 | A * | 7/1997 | Maydan | C23C 16/45574 118/723 E |
| 5,678,595 | A * | 10/1997 | Iwabuchi | F16K 31/1221 137/341 |
| 5,728,223 | A * | 3/1998 | Murakami | C23C 16/455 118/715 |
| 5,772,771 | A * | 6/1998 | Li | C23C 16/4405 118/715 |
| 6,013,155 | A * | 1/2000 | McMillin | C23C 16/455 118/723 I |
| 6,070,551 | A * | 6/2000 | Li | C23C 16/401 118/723 I |
| 6,106,663 | A * | 8/2000 | Kuthi | H01J 37/32082 156/345.34 |
| 6,143,078 | A * | 11/2000 | Ishikawa | H01L 21/67017 118/715 |
| 6,270,862 | B1 * | 8/2001 | McMillin | C23C 16/45578 427/569 |
| 6,302,965 | B1 * | 10/2001 | Umotoy | C23C 16/16 118/715 |
| 6,453,992 | B1 * | 9/2002 | Kim | C23C 16/45565 118/666 |
| 6,916,398 | B2 * | 7/2005 | Chen | C23C 16/34 118/715 |
| 6,983,892 | B2 | 1/2006 | Noorbakhsh et al. | |
| 7,740,706 | B2 * | 6/2010 | Park | C23C 16/45591 118/715 |
| 7,758,698 | B2 * | 7/2010 | Bang | C23C 16/4405 118/715 |
| 7,785,417 | B2 * | 8/2010 | Ni | H01J 37/3244 118/715 |
| 7,799,704 | B2 * | 9/2010 | Park | C23C 16/4404 438/778 |
| 8,025,731 | B2 * | 9/2011 | Ni | H01J 37/3244 118/715 |
| 8,945,306 | B2 * | 2/2015 | Tsuda | C23C 16/45559 118/715 |
| 9,209,000 | B2 * | 12/2015 | Qiu | C23C 16/45519 |
| 2002/0086106 | A1 * | 7/2002 | Park | C23C 16/45563 427/248.1 |
| 2002/0088545 | A1 * | 7/2002 | Lee | C23C 16/45565 156/345.33 |
| 2002/0129768 | A1 * | 9/2002 | Carpenter | C30B 25/08 118/715 |
| 2002/0179247 | A1 * | 12/2002 | Davis | C23C 16/4405 156/345.33 |
| 2003/0000924 | A1 * | 1/2003 | Strang | H01J 37/3244 216/86 |
| 2003/0070620 | A1 * | 4/2003 | Cooperberg | C23C 16/45574 118/723 AN |
| 2003/0141178 | A1 * | 7/2003 | Shan | G10K 15/06 204/157.15 |
| 2005/0092245 | A1 * | 5/2005 | Moon | H01J 37/3244 118/715 |
| 2006/0096540 | A1 * | 5/2006 | Choi | C23C 16/45578 118/724 |
| 2006/0196420 | A1 | 9/2006 | Ushakov et al. | |
| 2006/0219361 | A1 * | 10/2006 | Wang | H01J 37/3244 156/345.33 |
| 2007/0187363 | A1 * | 8/2007 | Oka | H01J 37/3244 216/59 |
| 2009/0250334 | A1 * | 10/2009 | Qiu | H01J 37/32174 204/164 |
| 2010/0310772 | A1 * | 12/2010 | Tsuda | C23C 16/409 427/255.28 |
| 2011/0121108 | A1 | 5/2011 | Rodewald et al. | |
| 2012/0036775 | A1 | 2/2012 | Sprouse et al. | |
| 2012/0097331 | A1 * | 4/2012 | Qiu | H01L 21/31138 156/345.34 |
| 2012/0193456 | A1 | 8/2012 | Lubomirsky et al. | |
| 2012/0247673 | A1 | 10/2012 | Hayashi et al. | |
| 2013/0156940 | A1 | 6/2013 | Wu et al. | |
| 2014/0014745 | A1 | 1/2014 | Burrows et al. | |
| 2014/0283995 | A1 | 9/2014 | Tanaka | |

FOREIGN PATENT DOCUMENTS

| | | |
|---|---|---|
| CN | 102945783 | 2/2013 |
| JP | 2006-245533 | 9/2006 |
| JP | 2007-220504 | 8/2007 |
| JP | 2007-243138 | 9/2007 |
| WO | WO 2013-065666 | 5/2013 |

OTHER PUBLICATIONS

Final Office Action from U.S. Appl. No. 14/461,318, dated Jun. 6, 2017, 7 pgs.
Final Office Action from U.S. Appl. No. 14/461,318, dated Sep. 6, 2017, 9 pgs.
Non-Final Office Action from U.S. Appl. No. 14/461,318, dated Feb. 8, 2018, 10 pgs.
Final Office Action from U.S. Appl. No. 14/461,318, dated Jul. 6, 2018, 5 pgs.
Final Office Action from U.S. Appl. No. 14/461,318, dated Oct. 29, 2018, 8 pgs.
Non-Final Office Action from U.S. Appl. No. 14/461,318, dated Mar. 8, 2019, 8 pgs.
International Search Report and Written Opinion for International Application No. PCT/US2015/043109, dated Nov. 25, 2015, 11 pgs.
International Preliminary Report on Patentability for International Application No. PCT/US2015/043019, dated Mar. 2, 2017, 8 pgs.
Notice of First Office Action from Chinese Patent Application No. 201580043841.3 dated Dec. 5, 2017, 9 pgs.

(56) References Cited

OTHER PUBLICATIONS

Second Office Action from Chinese Patent Application No. 201580043841.3 dated May 28, 2018, 6 pgs.
Official Letter from TIPO for Taiwan Patent Application No. 104125127, dated Dec. 10, 2018, 9 pgs.
Official Action for Taiwan Patent Application No. 104125127, dated Apr. 1, 2019, 10 pgs.
Notice of Reasons for Rejection for Japanese Patent Application No. 2017-507997, dated May 28, 2019, 7 pgs.

* cited by examiner

NOZZLE FOR UNIFORM PLASMA PROCESSING

CROSS-REFERENCE TO RELATED APPLICATIONS

This application is a divisional of U.S. patent application Ser. No. 14/461,318, filed on Aug. 15, 2014, the entire contents of which are hereby incorporated by reference herein.

FIELD

Embodiments of the present invention pertain to the field of electronic device manufacturing, and in particular, to fabricating a nozzle for uniform plasma processing.

BACKGROUND

Currently, many electronic systems, for example, high voltage Integrated Circuits (ICs), microelectromechanical systems (MEMS), optoelectronics, and other electronic systems require high aspect ratio vias and trenches. Generally, fabrication of electronic components, e.g., vias, trenches, pillars involves etching a semiconductor substrate. Typically, high aspect ratio through silicon vias (TSVs) and trenches are manufactured using a Bosch process that alternates repeatedly between plasma etch and deposition modes. Typically, Bosch process uses repetitions of alternate plasma deposition and etch modes to create a polymer side surface passivation layer while etching the via in a vertical direction.

Currently the polymer passivation layer deposited has an undesirable non-uniform profile. Via fabrication is currently limited with the existing standard nozzle.

Generally, the non-uniformity of the plasma etch and deposition across the wafer leads to variations of the profiles of the electronic components (e.g., pillars, vias, and trenches). That is, any non-uniformity in any of plasma deposition and etch operations can significantly impact not just the via depth uniformity but also profile uniformity across the wafer. Additionally, non-uniformity of the plasma etch and deposition across the wafer can introduce the electronic device defects (e.g., striations, bowing and tapering). As such, the non-uniformity of the plasma etch and deposition across the wafer impacts yield and increases the cost of electronic device manufacturing.

SUMMARY

Methods and apparatuses to provide a nozzle for uniform plasma processing are described. In one embodiment, a nozzle for uniform plasma processing comprises an inlet portion and an outlet portion. The inlet portion has a side surface extending substantially parallel to a vertical axis. The inlet portion comprises a plurality of gas channels. The outlet portion is coupled to the inlet portion. The outlet portion comprises a plurality of outlets. At least one of the outlets is at an angle other than a right angle relative to the vertical axis.

In one embodiment, a nozzle for uniform plasma processing comprises an inlet portion and an outlet portion. The inlet portion has a side surface substantially parallel to a vertical axis. The inlet portion comprises a plurality of gas channels. The outlet portion is coupled to the inlet portion. The outlet portion comprises a plurality of outlets. At least one of the outlets is at an angle other than a right angle relative to the vertical axis. At least one of the gas channels extends at an angle relative to the vertical axis.

In one embodiment, a nozzle for uniform plasma processing comprises an inlet portion and an outlet portion. The inlet portion has a side surface substantially parallel to a vertical axis. The inlet portion comprises a plurality of gas channels. The outlet portion is coupled to the inlet portion. The outlet portion comprises a plurality of outlets. At least one of the outlets is at an angle other than a right angle relative to the vertical axis. A cavity is between the inlet portion and the outlet portion.

In one embodiment, a nozzle for uniform plasma processing comprises an inlet portion and an outlet portion. The inlet portion has a side surface substantially parallel to a vertical axis. The inlet portion comprises a plurality of gas channels. The outlet portion is coupled to the inlet portion. The outlet portion comprises a plurality of outlets. At least one of the outlets is at an angle other than a right angle relative to the vertical axis. The outlet portion has a convex shape.

In one embodiment, a nozzle for uniform plasma processing comprises an inlet portion and an outlet portion. The inlet portion has a side surface substantially parallel to a vertical axis. The inlet portion comprises a plurality of gas channels. The outlet portion is coupled to the inlet portion. The outlet portion comprises a plurality of outlets. At least one of the outlets is at an angle other than a right angle relative to the vertical axis. The outlet portion has a concave shape.

In one embodiment, a nozzle for uniform plasma processing comprises an inlet portion and an outlet portion. The inlet portion has a side surface substantially parallel to a vertical axis. The inlet portion comprises a plurality of gas channels. The outlet portion is coupled to the inlet portion. The outlet portion comprises a plurality of outlets. At least one of the outlets is at an angle other than a right angle relative to the vertical axis. The outlet portion comprises at least one step.

In one embodiment, a nozzle for uniform plasma processing comprises an inlet portion and an outlet portion. The inlet portion has a side surface substantially parallel to a vertical axis. The inlet portion comprises a plurality of gas channels. The outlet portion is coupled to the inlet portion. The outlet portion comprises a plurality of outlets. At least one of the outlets is at an angle other than a right angle relative to the vertical axis. The outlet portion comprises a side surface that extends at an angle to the vertical axis.

In one embodiment, a nozzle for uniform plasma processing comprises an inlet portion and an outlet portion. The inlet portion has a side surface substantially parallel to a vertical axis. The inlet portion comprises a plurality of gas channels. The outlet portion is coupled to the inlet portion. The outlet portion comprises a plurality of outlets. At least one of the outlets is at an angle other than a right angle relative to the vertical axis. The number of outlets is greater than the number of gas channels.

In an embodiment, a plasma processing system comprises a processing chamber, a plasma source, and a nozzle coupled to the plasma source to receive a gas to generate plasma in the processing chamber. The processing chamber comprises a pedestal to hold a workpiece comprising a substrate. The nozzle comprises an inlet portion and an outlet portion coupled to the inlet portion. The inlet portion comprises a side surface substantially parallel to a vertical axis. The inlet portion comprises a plurality of gas channels. The outlet portion comprises a plurality of outlets. At least one of the outlets is at an angle other than a right angle relative to the vertical axis.

In an embodiment, a plasma processing system comprises a processing chamber, a plasma source, and a nozzle coupled to the plasma source to receive a gas to generate plasma in the processing chamber. The processing chamber comprises a pedestal to hold a workpiece comprising a substrate. The nozzle comprises an inlet portion and an outlet portion coupled to the inlet portion. The inlet portion comprises a side surface substantially parallel to a vertical axis. The inlet portion comprises a plurality of gas channels. The outlet portion comprises a plurality of outlets. At least one of the outlets is at an angle other than a right angle relative to the vertical axis. At least one of the gas channels extends at an angle relative to the vertical axis.

In an embodiment, a plasma processing system comprises a processing chamber, a plasma source, and a nozzle coupled to the plasma source to receive a gas to generate plasma in the processing chamber. The processing chamber comprises a pedestal to hold a workpiece comprising a substrate. The nozzle comprises an inlet portion and an outlet portion coupled to the inlet portion. The inlet portion comprises a side surface substantially parallel to a vertical axis. The inlet portion comprises a plurality of gas channels. The outlet portion comprises a plurality of outlets. At least one of the outlets is at an angle other than a right angle relative to the vertical axis. A cavity is between the inlet portion and the outlet portion.

In an embodiment, a plasma processing system comprises a processing chamber, a plasma source, and a nozzle coupled to the plasma source to receive a gas to generate plasma in the processing chamber. The processing chamber comprises a pedestal to hold a workpiece comprising a substrate. The nozzle comprises an inlet portion and an outlet portion coupled to the inlet portion. The inlet portion comprises a side surface substantially parallel to a vertical axis. The inlet portion comprises a plurality of gas channels. The outlet portion comprises a plurality of outlets. At least one of the outlets is at an angle other than a right angle relative to the vertical axis. The outlet portion has a convex shape.

In an embodiment, a plasma processing system comprises a processing chamber, a plasma source, and a nozzle coupled to the plasma source to receive a gas to generate plasma in the processing chamber. The processing chamber comprises a pedestal to hold a workpiece comprising a substrate. The nozzle comprises an inlet portion and an outlet portion coupled to the inlet portion. The inlet portion comprises a side surface substantially parallel to a vertical axis. The inlet portion comprises a plurality of gas channels. The outlet portion comprises a plurality of outlets. At least one of the outlets is at an angle other than a right angle relative to the vertical axis. The outlet portion has a concave shape.

In an embodiment, a plasma processing system comprises a processing chamber, a plasma source, and a nozzle coupled to the plasma source to receive a gas to generate plasma in the processing chamber. The processing chamber comprises a pedestal to hold a workpiece comprising a substrate. The nozzle comprises an inlet portion and an outlet portion coupled to the inlet portion. The inlet portion comprises a side surface substantially parallel to a vertical axis. The inlet portion comprises a plurality of gas channels. The outlet portion comprises a plurality of outlets. At least one of the outlets is at an angle other than a right angle relative to the vertical axis. The outlet portion comprises at least one step.

In an embodiment, a plasma processing system comprises a processing chamber, a plasma source, and a nozzle coupled to the plasma source to receive a gas to generate plasma in the processing chamber. The processing chamber comprises a pedestal to hold a workpiece comprising a substrate. The nozzle comprises an inlet portion and an outlet portion coupled to the inlet portion. The inlet portion comprises a side surface substantially parallel to a vertical axis. The inlet portion comprises a plurality of gas channels. The outlet portion comprises a plurality of outlets. At least one of the outlets is at an angle other than a right angle relative to the vertical axis. The outlet portion comprises a side surface that extends at an angle to the vertical axis.

In an embodiment, a plasma processing system comprises a processing chamber, a plasma source, and a nozzle coupled to the plasma source to receive a gas to generate plasma in the processing chamber. The processing chamber comprises a pedestal to hold a workpiece comprising a substrate. The nozzle comprises an inlet portion and an outlet portion coupled to the inlet portion. The inlet portion comprises a side surface substantially parallel to a vertical axis. The inlet portion comprises a plurality of gas channels. The outlet portion comprises a plurality of outlets. At least one of the outlets is at an angle other than a right angle relative to the vertical axis. The number of outlets is greater than the number of gas channels.

In one embodiment, an inlet portion of a nozzle comprising a plurality of gas channels is formed. The inlet portion has a side surface substantially parallel to a vertical axis. An outlet portion coupled to the inlet portion is formed. The outlet portion comprises a plurality of outlets. At least one of the outlets is at an angle other than a right angle relative to the vertical axis.

In one embodiment, an inlet portion of a nozzle comprising a plurality of gas channels is formed. The inlet portion has a side surface substantially parallel to a vertical axis. An outlet portion coupled to the inlet portion is formed. The outlet portion comprises a plurality of outlets. At least one of the outlets is at an angle other than a right angle relative to the vertical axis. At least one of the gas channels is at an angle relative to the vertical axis.

In one embodiment, an inlet portion of a nozzle comprising a plurality of gas channels is formed. The inlet portion has a side surface substantially parallel to a vertical axis. An outlet portion coupled to the inlet portion is formed. The outlet portion comprises a plurality of outlets. At least one of the outlets is at an angle other than a right angle relative to the vertical axis. A cavity is formed between the inlet portion and the outlet portion.

In one embodiment, an inlet portion of a nozzle comprising a plurality of gas channels is formed. The inlet portion has a side surface substantially parallel to a vertical axis. An outlet portion coupled to the inlet portion is formed. The outlet portion comprises a plurality of outlets. At least one of the outlets is at an angle other than a right angle relative to the vertical axis. The outlet portion has a convex shape.

In one embodiment, an inlet portion of a nozzle comprising a plurality of gas channels is formed. The inlet portion has a side surface substantially parallel to a vertical axis. An outlet portion coupled to the inlet portion is formed. The outlet portion comprises a plurality of outlets. At least one of the outlets is at an angle other than a right angle relative to the vertical axis. The outlet portion has a concave shape.

In one embodiment, an inlet portion of a nozzle comprising a plurality of gas channels is formed. The inlet portion has a side surface substantially parallel to a vertical axis. An outlet portion coupled to the inlet portion is formed. The outlet portion comprises a plurality of outlets. At least one of the outlets is at an angle other than a right angle relative to the vertical axis. The number of outlets is greater than the number of gas channels.

In one embodiment, an inlet portion of a nozzle comprising a plurality of gas channels is formed. The inlet portion has a side surface substantially parallel to a vertical axis. An outlet portion coupled to the inlet portion is formed. The outlet portion comprises a plurality of outlets. At least one of the outlets is at an angle other than a right angle relative to the vertical axis. The outlet portion comprises at least one step.

Other features of the present invention will be apparent from the accompanying drawings and from the detailed description which follows.

BRIEF DESCRIPTION OF THE DRAWINGS

The embodiments as described herein are illustrated by way of example and not limitation in the figures of the accompanying drawings in which like references indicate similar elements.

DETAILED DESCRIPTION

Figure 1:
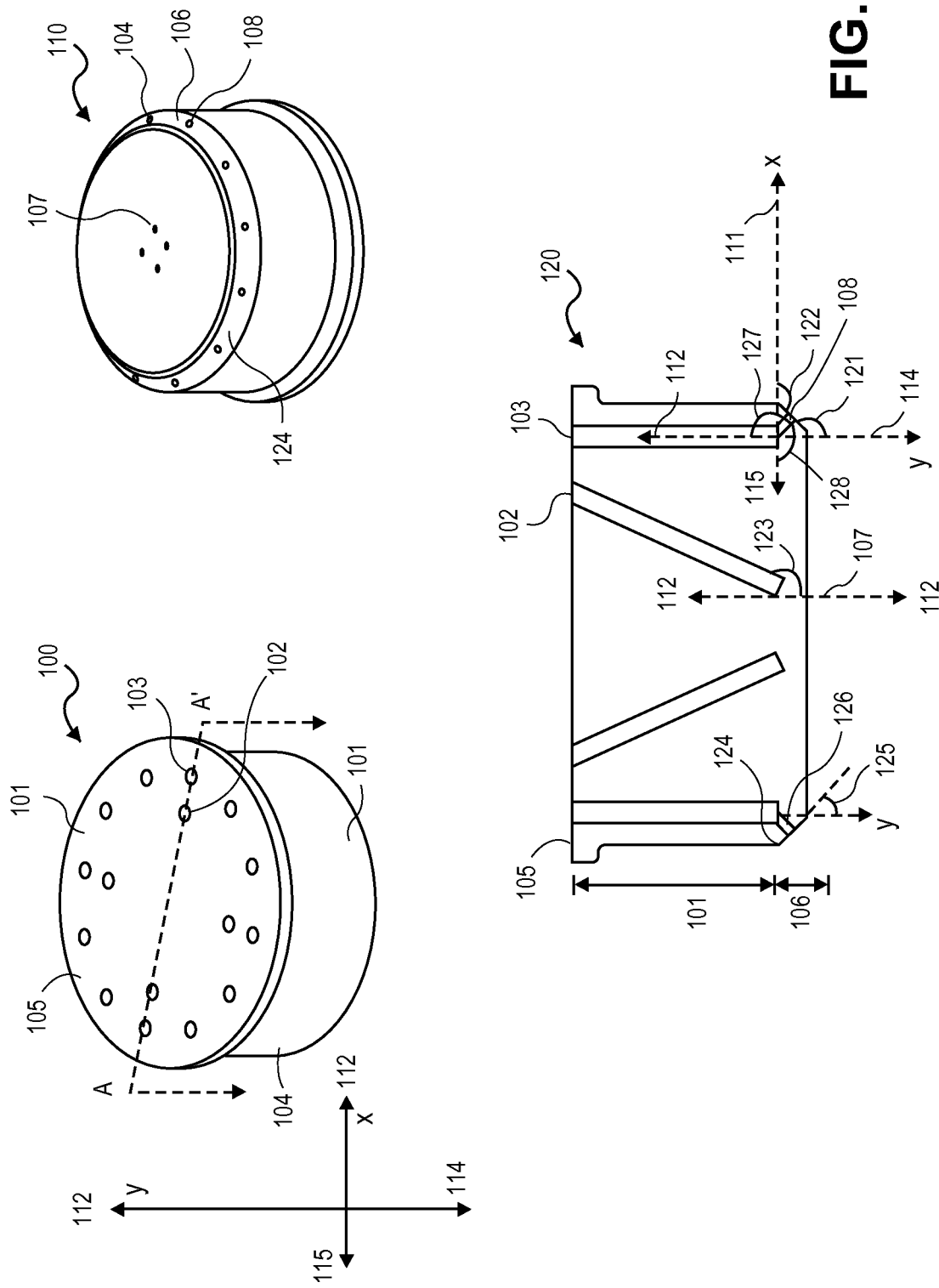
FIG. 1 shows a nozzle for uniform plasma processing according to one embodiment of the invention.

In the following description, numerous specific details, such as specific materials, chemistries, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

Methods and apparatuses to provide a shower nozzle to increase uniformity substantially parallel to a wafer for plasma processing are described. The existing gas nozzles have a limited number of horizontal and vertical gas channels and do not provide uniform gas flow velocity distribution across the wafer.

In one embodiment, a shower nozzle to increase uniformity substantially parallel to a wafer for plasma processing comprises an inlet portion and an outlet portion. The inlet portion has a side surface substantially parallel to a vertical axis. The inlet portion comprises a plurality of gas channels. The outlet portion is coupled to the inlet portion. The outlet portion comprises a plurality of outlets. At least one of the outlets is at an angle other than a right angle relative to the vertical axis. In an embodiment, the nozzle distributes a shower of gases towards a wafer that is significantly more uniform than that of existing nozzle designs and advantageously increasing uniformity of plasma processing substantially parallel to the wafer, as described in further detail below.

In an embodiment, the nozzle advantageously prevents localized plasma ignition at the nozzle, as described in further detail below. The embodiments of the nozzle described herein can be easily assembled and installed onto an existing plasma chamber lid advantageously saving manufacturing cost, as described in further detail below. In an embodiment, the nozzle provides a gas flow having a velocity at the centre of the wafer greater than that of existing nozzle designs, as described in further detail below. In an embodiment, the nozzle advantageously outputs a gas flow having a velocity at the centre of the wafer greater than that of existing nozzle designs, as described in further detail below.

Generally, the nozzle for plasma processing is a device designed to control characteristics (e.g., rate, velocity, direction, mass, shape, pressure, or any combination thereof) of a gas flow in a plasma processing chamber. In an embodiment, the plasma deposition and etch uniformity depend on the gas distribution in the chamber. In an embodiment, the etch uniformity depends more on inductively coupled plasma (ICP) power distribution than on the gas distribution in the chamber, whereas the polymer deposition uniformity is affected more by the gas distribution than by the ICP power distribution. In an embodiment, modeling based on Computational Fluid Dynamic (CFD) is used to identify the shortcomings of the existing nozzles and to develop a nozzle for uniform gas flow distribution over a wafer in a plasma processing chamber.

In an embodiment, the nozzle comprising an inlet portion and outlet portion as described with respect to FIGS. 1-5 below provides an advantage as the outlet nozzle portion distributes uniform shower of gases onto the wafer. In an embodiment, the gas channel design of the nozzle as described with respect to FIGS. 1-5 advantageously prevents localized plasma ignition at the nozzle. In an embodiment, the two parts nozzle as described with respect to FIGS. 3-5 below provides an advantage as it allows gases to be built up within the cavity between the inlet portion and the outlet portion to output a smooth shower like flow towards the wafer.

FIG. 1 shows a nozzle for uniform plasma processing according to one embodiment of the invention. A view 100 is a top three dimensional view of the nozzle. A view 110 is a bottom three dimensional view of the nozzle. A view 120 is a cross-sectional view of the nozzle substantially parallel to an A-A' axis. As shown in FIG. 1, the nozzle comprises an inlet portion 101 and an outlet portion 106. Outlet portion 106 and inlet portion 101 form a single continuous part without a cavity. Inlet portion 101 comprises a side surface 104 substantially parallel to a vertical Y axis 112. In an embodiment, inlet portion 101 has a cylindrical shape. In an embodiment, outlet portion 106 has a cylindrical shape. The inlet portion has a top surface 105 substantially parallel to a horizontal X axis 111. In an embodiment, top surface 105 is configured to provide compatibility with an existing lid design of the processing chamber. The inlet portion comprises a plurality of gas channels, such as gas channels 102 and 103 that pass through the top surface 105 down to the outlet portion 106. The gas channels passing through the top surface 105 are represented by a plurality of inlet holes in view 100. As shown in view 120, at least one of the gas channels, e.g., gas channel 102 extends at an angle 123 relative to the vertical Y axis. As shown in view 120, at least one of the gas channels, e.g., gas channel 103 extends substantially parallel to the vertical Y axis.

The outlet portion 106 is below the inlet portion 101. The outlet portion 106 comprises a plurality of gas outlets, such as a gas outlet 107, a gas outlet 108 and a gas outlet 126 that pass through the bottom of the outlet portion 106. The gas outlets passing through the bottom of the outer part 506 are represented by a plurality of outlet holes in view 110. As shown in views 110 and 120, gas outlet 107 is one of the gas outlets that are located around a center of the outlet portion bottom. The gas outlets 108 and 126 pass through a side surface 124. As shown in views 120 and 110, the side surface 124 extends at an angle 125 relative to the vertical Y axis. In an embodiment, at least one of the gas outlets extends in the outlet portion at the angles other than the right (90 degree) angles relative to the vertical Y and horizontal X axes. In an embodiment, at least one of the gas outlets extends in the outlet portion substantially parallel to the vertical Y. As shown in view 120 of FIG. 1, gas outlet 108 is at an acute angle 121 (the angle smaller than the 90 degree angle) relative to the vertical Y axis extending in a downward direction 114 and at an obtuse angle 127 (the angle greater than 90 degrees) relative to the to the vertical Y axis extending in an upward direction 112. Gas outlet 108 is at an acute angle 122 relative to the horizontal X axis extending in a right direction 111 and is at an obtuse angle 128 relative to the horizontal X axis extending in a left direction 115. As shown in view 120, gas outlet 126 is at the angles other than the 90 degree angle relative to the vertical Y and horizontal X axes.

In an embodiment, the number of inlet holes associated with the gas channels passing through the top surface 105 is the same as the number of holes associated with the outlets passing through the outer surface of the outlet portion 106. In more specific embodiment, the number of inlet holes is about 16 and the number of outlet holes is about 16. In an embodiment, the number of outlet holes of the outlet portion 106 is greater than the number of inlet holes of the inlet portion 101.

In an embodiment, the inlet hole diameter is greater than the outlet hole diameter. In an embodiment, the inlet hole diameter is from about 0.08 inches to about 0.14 inches. In more specific embodiment, the inlet hole diameter is about 0.12 inches. In an embodiment, the outlet hole diameter is from about 0.03 inches to about 0.07 inches. In more specific embodiment, the outlet hole diameter is about 0.05 inches.

Figure 2:
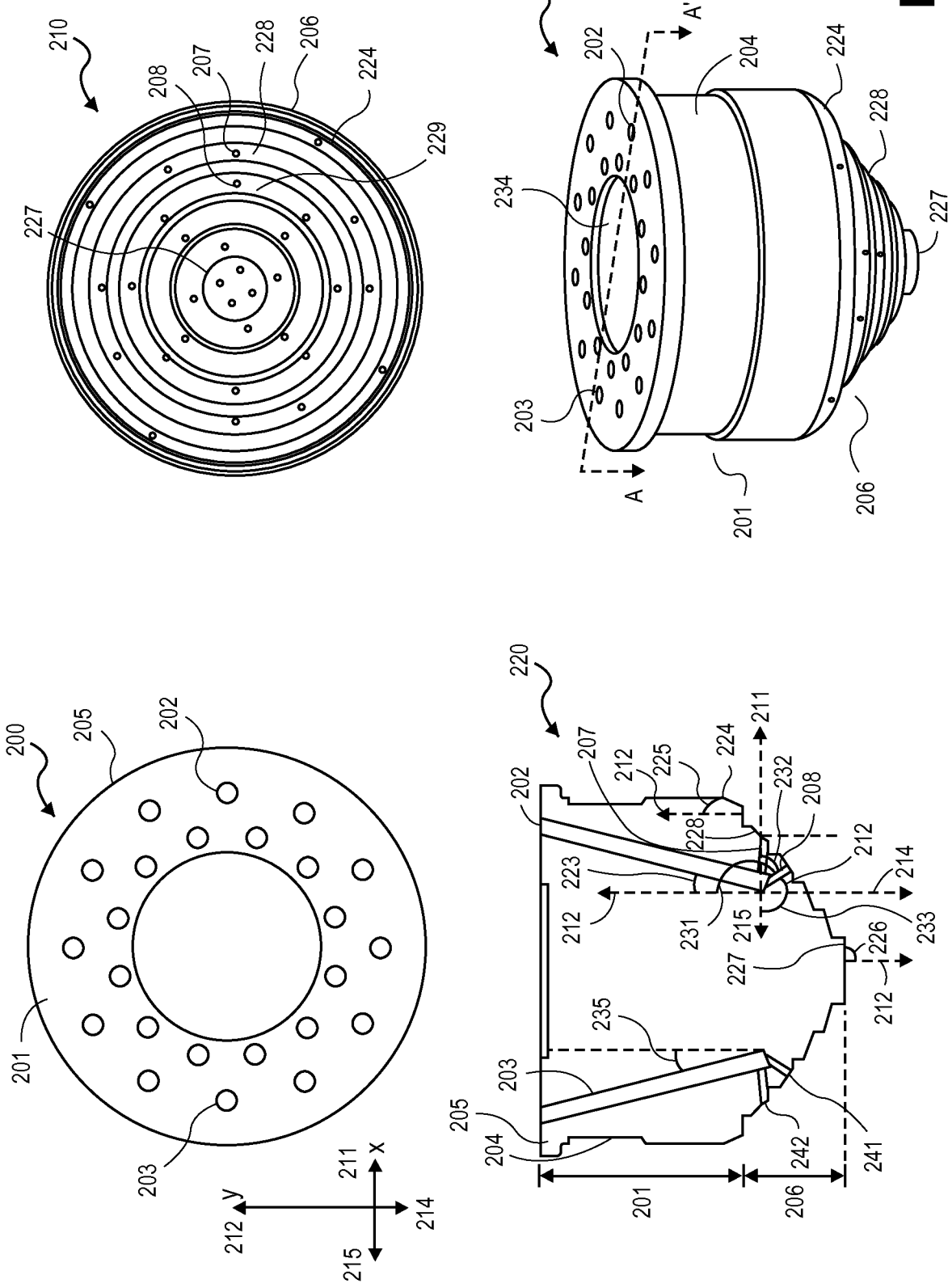
FIG. 2 shows a nozzle for uniform plasma processing according to one embodiment of the invention.

FIG. 2 shows a nozzle for uniform plasma processing according to one embodiment of the invention. A view 200 is a top view of the nozzle. A view 210 is a bottom view of the nozzle. A view 230 is a three dimensional view of the nozzle. A view 220 is a cross-sectional view of the nozzle substantially parallel to an A-A' axis.

As shown in FIG. 2, the nozzle comprises an inlet portion 201 and an outlet portion 206. Outlet portion 206 and inlet portion 201 form a single continuous part without a cavity. Inlet portion 201 comprises a top surface 205 substantially parallel to a horizontal X axis 211 and a plurality of gas channels, such as gas channels 202 and 203 that pass through the top surface 205. In an embodiment, inlet portion 201 has a cylindrical shape. Inlet portion 201 has a window pocket 234 on top surface 205 to provide compatibility with an existing lid design of the processing chamber (not shown) or otherwise couple to a lid of the processing chamber.

The gas channels, such as gas channels 202 and 203 that pass through the top surface 205 are represented by a plurality of inlet holes in views 200 and 230. At least one of the gas channels is at an angle relative to a side surface 204 which is substantially parallel to the vertical Y axis 212. As shown in view 220, gas channel 202 extends at an angle 223 relative to the vertical Y axis 212. As shown in FIG. 2, gas channel 202 is at an acute angle 235 relative to the vertical Y axis 212. In an embodiment, at least one of the gas channels in the inlet portion 201 is parallel to the vertical Y axis. The outlet portion 206 is below the inlet portion 201. The outlet portion 206 comprises a plurality of gas outlets, such as a gas outlet 207 and a gas outlet 208 that pass through the bottom surface of the outlet portion 206 at varying angles. The gas outlets, such as gas outlets 207 and 208 that pass through the bottom surface of the outer part 206 are represented by a plurality of outlet holes in view 210.

As shown in FIG. 2, the outlet portion of the nozzle comprises concentric steps, such as a first step 224, a step 228, a step 229 and a last step 227 at a bottom center of the outlet portion 206. The gas outlets extend through the wall of the outlet portion 206, so that the holes associated with the outlets are located on each of the steps. As depicted in view 210, the hole of the outlet 207 is on the step 228, the hole of the outlet 208 is on step 229. In an embodiment, a gas channel of the inlet portion 201 is coupled to a plurality of gas outlets of the outlet portion 206. As shown in view 220, gas channel 203 is connected to gas outlets 241 and 242.

In an embodiment, at least one of the gas outlets extends in the outlet portion at the angles other than 90 degrees relative to the vertical Y and horizontal X axes. In an embodiment, at least one of the gas outlets extends in the outlet portion substantially parallel to the vertical Y axis. As shown in view 220, gas outlet 208 is at an acute angle 221 relative to the vertical Y axis extending in a downward direction 214 and at an obtuse angle 231 relative to the vertical Y axis extending in an upward direction 212. Gas outlet 208 is at an acute angle 232 relative to the horizontal X axis extending in a right direction 211 and at an obtuse angle 233 relative to the horizontal X axis extending in a left direction 215.

As depicted in view 220, a first step 224 is at an acute angle 225 relative to the vertical Y axis, and last step 227 is at an angle 226 relative to the vertical Y axis. In an embodiment, the first step 224 is at about 30 degrees relative to the vertical Y axis, the subsequent steps are formed with 12 degrees increments, and the last step 227 is at about 90 degrees relative to the vertical Y axis. In an embodiment, each of the steps includes four or eight outlet holes. As shown in view 210, step 227 has four outlet holes, each of the steps 228 and 229 has eight outlet holes.

In an embodiment, the number of inlet holes to the gas channels passing through the top surface 205 is the same as the number of holes associated with the outlets passing through the stepped bottom surface of the outlet portion 206. In more specific embodiment, the number of inlet holes is about 24 and the number of outlet holes is about 24. In an embodiment, the number of outlet holes of the outlet portion 206 is greater than the number of inlet holes of the inlet portion 201.

In an embodiment, the inlet hole diameter is greater than the outlet hole diameter. In an embodiment, the inlet hole diameter is from about 0.08 inches to about 0.14 inches. In more specific embodiment, the inlet hole diameter is about 0.12 inches. In an embodiment, the outlet hole diameter is from about 0.03 inches to about 0.07 inches. In more specific embodiment, the outlet hole diameter is about 0.05 inches.

In an embodiment, the nozzle to enhance the uniform distribution of shower like gas flow onto the wafer as shown in FIGS. 1-2 is made of a dielectric material, for example, ceramic, or other dielectric material. In an embodiment, the nozzle as shown in FIGS. 1-2 is manufactured via sintering, grinding and drilling process or other techniques known to one of ordinary skill in the art of nozzle manufacturing. In an embodiment, the gas channels and the outlets of the nozzle, as described with respect to FIG. 1 are formed via sintering, grinding and drilling process or other techniques known to one of ordinary skill in the art of nozzle manufacturing.

Figure 3:
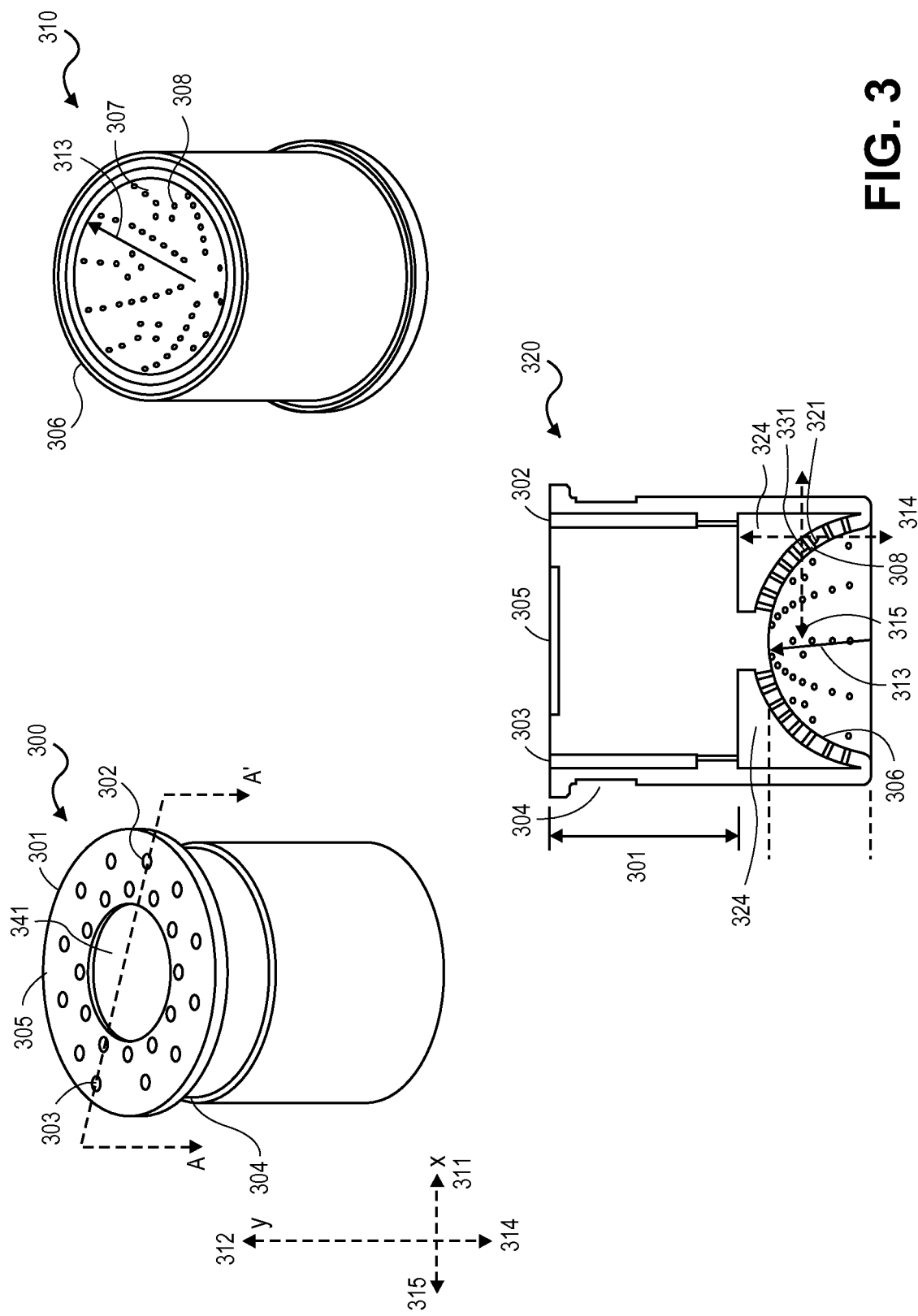
FIG. 3 shows a nozzle for uniform plasma processing according to one embodiment of the invention.

FIG. 3 shows a nozzle for uniform plasma processing according to one embodiment of the invention. A view 300 is a three dimensional top view of the nozzle. A view 310 is a three dimensional bottom view of the nozzle. A view 320 is a cross-sectional view of the nozzle substantially parallel to an A-A' axis.

As shown in FIG. 3, the nozzle comprises two parts. A first part comprises an inlet portion 301 and a second part comprises an outlet portion 306. As shown in FIG. 3, the outlet portion 306 has a concave shape, so that a cavity 324 is formed between the inlet portion 301 and the outlet portion 306. The outlet portion 306 has a concave radius 313. In an embodiment, the concave radius of the outlet portion 306 is from about 0.5 inches to about 1.5 inches. In more specific embodiment, the concave radius of the outlet portion 306 is about 1 inch.

The inlet portion 301 comprises a top surface 305 substantially parallel to a horizontal X axis 311 and a plurality of gas channels, such as gas channels 302 and 303 that pass through the top surface 305. The gas channels, such as gas channels 302 and 303 that pass through the top surface 305 are represented by a plurality of inlet holes in view 300. The inlet portion 301 has a side surface 304 substantially parallel to a vertical axis. In an embodiment, inlet portion 301 has a cylindrical shape. Inlet portion 301 has a window pocket 341 to provide compatibility with an existing lid design of the processing chamber (not shown) or otherwise couple to a lid of the processing chamber.

In an embodiment, at least one of the gas channels of the inlet portion 301 has an angle relative to the side surface 304. In an embodiment, at least one of the gas channels in the inlet portion 301 is parallel to the side surface 304 that is parallel to the vertical Y axis. As shown in FIG. 3, gas channels 302 and 303 are parallel to the vertical Y axis.

The outlet portion 306 is below the inlet portion 301. The outlet portion 306 comprises a plurality of gas outlets, such as a gas outlet 307 and a gas outlet 308 that pass through the concave bottom wall of the outer part 306 at varying angles, as shown in view 320. The gas outlets, such as gas outlets 307 and 308 that pass through the concave bottom wall of the outer part 306 are represented by a plurality of outlet holes in views 310 and 320. In an embodiment, at least one of the gas outlets that pass through the outlet portion concave bottom wall is at the angles other than the 90 degree angles relative to the vertical Y and horizontal X axes. In an embodiment, at least one of the gas outlets passing through the outlet portion concave bottom wall is substantially parallel to the vertical Y axes. In an embodiment, at least one of the gas outlets which is substantially parallel to the vertical Y axes passes through a center of the outlet portion concave bottom wall. As shown in view 320, gas outlet 308 is at an acute angle 321 relative to the vertical Y axis extending in a downward direction 314. Gas outlet 308 is at an acute angle 331 relative to the horizontal X axis extending in a left direction 315.

In an embodiment, the number of inlet holes associated with the gas channels passing through the top surface 305 are smaller than the number of holes associated with the outlets passing through the concave outlet portion 306. In more specific embodiment, the number of inlet holes is about 24 and the number of outlet holes is about 84. In an embodiment, the inlet hole diameter is greater than the outlet hole diameter. In an embodiment, the inlet hole diameter is from about 0.08 inches to about 0.14 inches. In more specific embodiment, the inlet hole diameter is about 0.12 inches. In an embodiment, the outlet hole diameter is from about 0.03 inches to about 0.07 inches. In more specific embodiment, the outlet hole diameter is about 0.05 inches.

Figure 4:
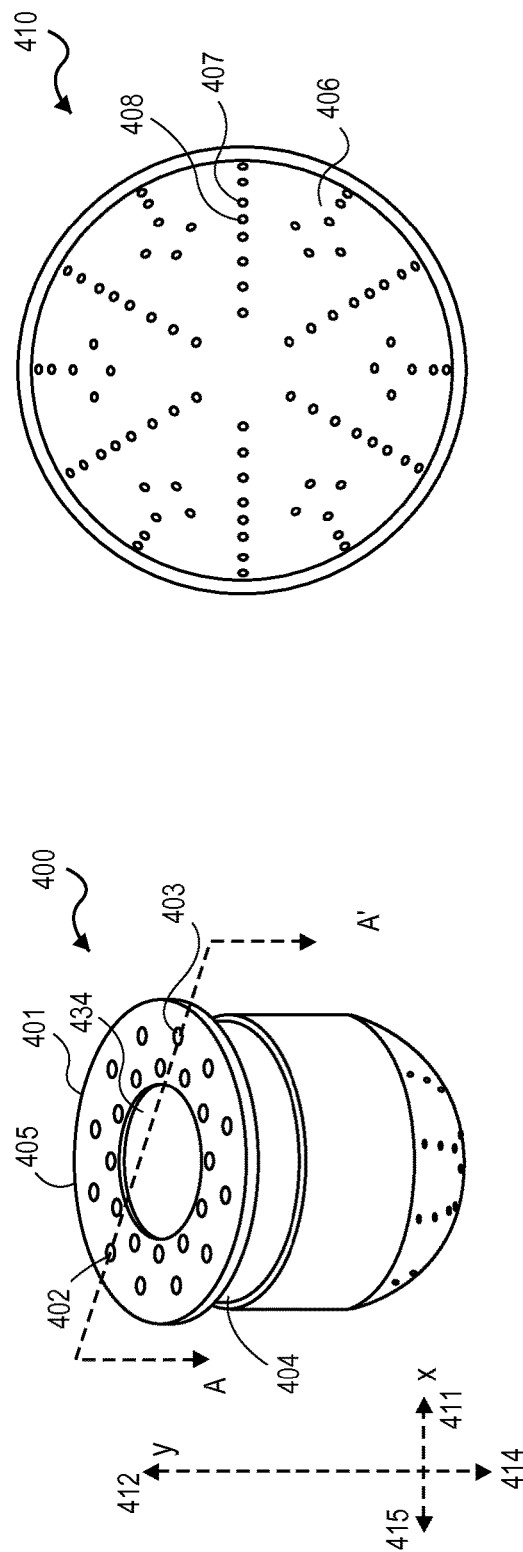
FIG. 4 shows a nozzle for uniform plasma processing according to one embodiment of the invention.
Figure 4:
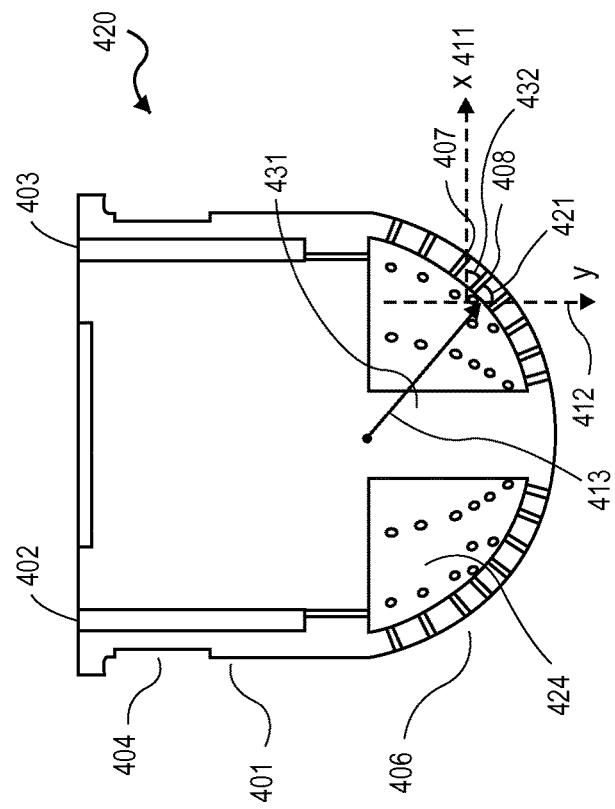

FIG. 4 shows a nozzle for uniform plasma processing according to one embodiment of the invention. A view 400 is a three dimensional view of the nozzle. A view 410 is a three dimensional bottom view of the nozzle. A view 420 is a cross-sectional view of the nozzle substantially parallel to an A-A' axis.

As shown in FIG. 4, the nozzle comprises two parts. A first part comprises an inlet portion 401 and a second part comprises an outlet portion 406. As shown in FIG. 4, the outlet portion 406 has a convex shape, so that a cavity 424 is formed between the inlet portion 401 and the outlet portion 406. The outlet portion 406 has a convex radius 413. In an embodiment, the convex radius 413 is from about 0.8 inches to about 1.8 inches. In more specific embodiment, the concave radius 413 is from about 1.24 inches to about 1.25 inches.

Inlet portion 401 comprises a top surface 405 substantially parallel to a horizontal X axis 411 and a plurality of gas channels, such as gas channels 402 and 403 that pass through the top surface 405. The gas channels, such as gas channels 402 and 403 that pass through the top surface 405 are represented by a plurality of inlet holes in view 400. The inlet portion 401 has a side surface 404 substantially parallel to a vertical Y axis 412.

In an embodiment, inlet portion 401 has a cylindrical shape. Inlet portion 401 has a window pocket 434 to provide compatibility with an existing lid design of the processing chamber (not shown) or otherwise couple to a lid of the processing chamber.

In an embodiment, at least one of the gas channels of the inlet portion 401 has an angle relative to the side surface 404. In an embodiment, at least one of the gas channels in the inlet portion 401 is parallel to the side surface 404. As shown in FIG. 4, gas channels 402 and 403 are parallel to the side surface 404.

The outlet portion 406 is below the inlet portion 401. The outlet portion 406 comprises a plurality of gas outlets, such as a gas outlet 407 and a gas outlet 408 that pass through the convex bottom of the outlet portion 406 at varying angles. The gas outlets, such as gas outlets 407 and 408 that pass through the convex bottom of the outer part 406 are represented by a plurality of outlet holes in views 410 and 420. A support feature 431 is in the cavity 424 between the inlet portion 401 and outlet portion 406. At least one of the gas outlets pass through the outlet portion wall at the angles other than the 90 degree angles relative to the vertical Y and horizontal X axes. As shown in view 420, gas outlet 408 is at an acute angle 421 relative to the vertical Y axis extending in a downward direction 414. Gas outlet 408 is at an acute angle 432 relative to the horizontal X axis extending in a right direction 411.

In an embodiment, the number of inlet holes associated with the gas channels passing through the top surface 405 are smaller than the number of holes associated with the outlets passing through the convex bottom of the outlet portion 406. In more specific embodiment, the number of inlet holes is about 24 and the number of outlet holes is about 110. In an embodiment, the inlet hole diameter is greater than the outlet hole diameter. In an embodiment, the inlet hole diameter is from about 0.08 inches to about 0.14 inches. In more specific embodiment, the inlet hole diameter is from about 0.10 inches to about 0.12 inches. In an embodiment, the outlet hole diameter is from about 0.03 inches to about 0.07 inches. In more specific embodiment, the outlet hole diameter is about 0.05 inches.

In an embodiment, in the two parts nozzle design as depicted in FIG. 4, comprising the inlet portion 401, and the outlet portion 406, the outlet nozzle portion distributes uniform shower of gases onto the wafer. The two parts nozzle design provides an advantage as it allows gases to be built up within the cavity between the inlet portion and the outlet portion before outputting a smooth shower like flow towards the wafer.

In an embodiment, the nozzle to enhance the uniform distribution of shower like gas flow onto the wafer as shown in FIGS. 3-4 is made of a dielectric material, for example, ceramic, or other dielectric material to enhance the uniform distribution of shower like gas flow onto the wafer.

In an embodiment, the two parts nozzle as shown in FIGS. 3-4 is manufactured via sintering, grinding and drilling process or other techniques known to one of ordinary skill in the art of nozzle manufacturing. In an embodiment, the gas channels and the outlets of the nozzle, as described with respect to FIGS. 3-4 are formed via sintering, grinding and drilling process or other techniques known to one of ordinary skill in the art of nozzle manufacturing.

Figure 5:
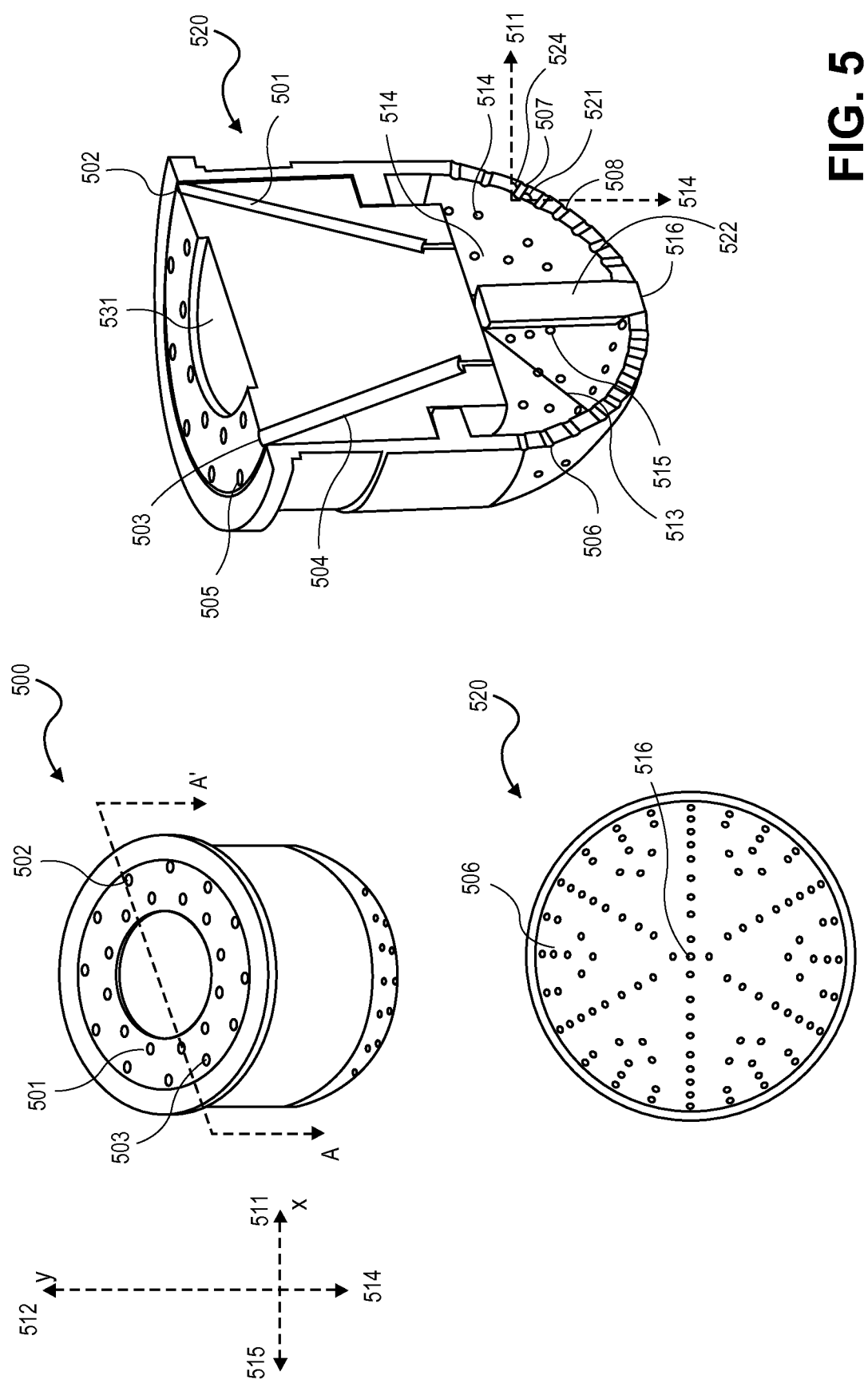
FIG. 5 shows a nozzle for uniform plasma processing according to one embodiment of the invention.

FIG. 5 shows a nozzle for uniform plasma processing according to one embodiment of the invention. A view 500 is a three dimensional top view of the nozzle. A view 510 is a cross-sectional view of the nozzle substantially parallel to an A-A' axis. A view 520 is a three dimensional bottom view of the nozzle. As shown in FIG. 5, the nozzle comprises two parts. An inner part 501 is placed within an outer part 506. Inner part 501 represents an inlet portion and outer part 506 represents an outlet portion. As shown in FIG. 5, the bottom wall of the outer part 506 has a convex shape, so that a cavity 534 is formed between the inlet portion and the outlet portion. The bottom wall of the outer portion 506 has a convex radius 513. In an embodiment, the convex radius 513 is from about 0.8 inches to about 1.8 inches. In more specific embodiment, the concave radius is from about 1.24 inches to about 1.25 inches.

As shown in view 510, the inner part 501 comprises an upper portion 518 and a lower portion 519. The diameter of the upper portion 518 greater than the diameter of the lower portion 519. The upper portion 518 is placed a support feature 517 that protrudes from an inner sidewall of the outside part 506. The inner part 501 has a top surface 505 which is substantially parallel to a horizontal X axis 511 and a plurality of gas channels that pass through the top surface 505. The gas channels, such as gas channels 502 and 503 that pass through the top surface 505 are represented by a plurality of inlet holes in view 500. The inner part 501 has a side surface 504 substantially parallel to a vertical axis 512. In an embodiment, inner part 501 has a cylindrical shape. Inner part 501 has a window pocket 531 to provide compatibility with an existing lid design of the processing chamber (not shown) or otherwise couple to a lid of the processing chamber.

As shown in view 520, each of the gas channels 502 and 503 is at an angle relative to the side surface 504. In an embodiment, at least one of the gas channels (not shown) in the inner part 501 is parallel to the side surface 504. The outer part 506 comprises a plurality of gas outlets, such as a gas outlet 507 and a gas outlet 508 that pass through the convex bottom wall of the outer part 506 at varying angles. The gas outlets, such as gas outlets 507 and 508 that pass through the convex wall of the outer part 506 are represented by a plurality of outlet holes in view 520. A support feature 522 is in the cavity 534 between the bottom of the inner part 501 and the convex wall of outer part 506. At least one of the gas outlets extends relative to the vertical Y and horizontal X axes at the angles other than the 90 degree angles. As shown in view 520, gas outlet 507 is at an acute angle 521 relative to the vertical Y axis extending in an upward direction 511. Gas outlet 507 is at an acute angle 524 relative to the horizontal X axis extending in a right direction 511. A gas outlet 516 passes through a center of the outer portion bottom, as shown in view 520.

In an embodiment, the number of inlet holes associated with the gas channels passing through the top surface 505 is smaller than the number of holes associated with the outlets passing through the convex wall of the outer part 506. In more specific embodiment, the number of inlet holes associated with the gas channels is about 24 and the number of outlet holes is about 114. In an embodiment, the inlet hole diameter is greater than the outlet hole diameter. In an embodiment, the inlet hole diameter is from about 0.08 inches to about 0.14 inches. In more specific embodiment, the inlet hole diameter is from about 0.10 inches to about 0.12 inches. In an embodiment, the outlet hole diameter is from about 0.03 inches to about 0.07 inches. In more specific embodiment, the outlet hole diameter is about 0.05 inches.

In an embodiment, in the two parts nozzle design as depicted in FIG. 5, comprising the inner inlet portion 501, and the outer outlet portion 506, the outer outlet nozzle portion distributes uniform shower of gases onto the wafer. The two parts nozzle design provides an advantage as it allows gases to be built up within the cavity between the inner inlet portion and the outer outlet portion before outputting a smooth shower like flow towards the wafer.

In an embodiment, the nozzle for uniform plasma processing as depicted in FIG. 5 is made of a dielectric material, for example, ceramic, or other dielectric material to enhance the uniform distribution of shower like gas flow onto the wafer. In an embodiment, the two parts nozzle as shown in FIG. 5 is manufactured via sintering, grinding and drilling process or other techniques known to one of ordinary skill in the art of nozzle manufacturing. In an embodiment, the gas channels and the outlets of the nozzle, as described with respect to FIG. 5 are formed via sintering, grinding and drilling process or other techniques known to one of ordinary skill in the art of nozzle manufacturing.

Figure 6:
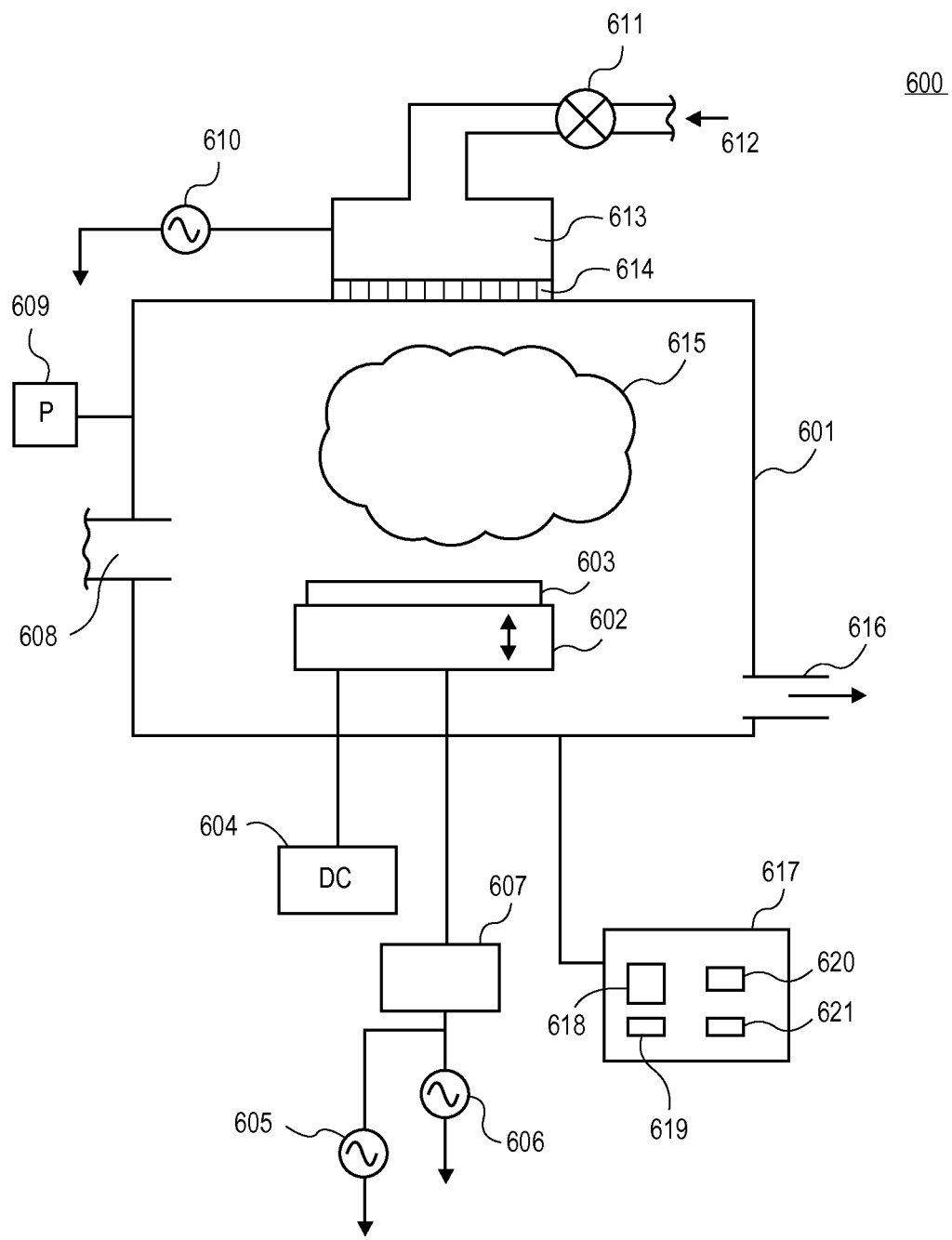
FIG. 6 shows a block diagram of one embodiment of a plasma system to increase uniformity of plasma processing.

FIG. 6 shows a block diagram of one embodiment of a plasma system 600 to increase uniformity of plasma processing. As shown in FIG. 6, system 600 has a processing chamber 101. A movable pedestal 602 to hold a workpiece 603 is placed in processing chamber 601. Pedestal 602 comprises an electrostatic chuck ("ESC"), a DC electrode embedded into the ESC, and a cooling/heating base. In an embodiment, pedestal 602 acts as a moving cathode. In an embodiment, the ESC comprises an $Al_2O_3$ material, $Y_2O_3$, or other ceramic materials known to one of ordinary skill of electronic device manufacturing. A DC power supply 604 is connected to the DC electrode of the pedestal 602.

As shown in FIG. 6, a workpiece 603 is loaded through an opening 608 and placed on the pedestal 602. In an embodiment, workpiece 603 is placed on the pedestal 602 substantially parallel to a horizontal axis 111. In an embodiment, the workpiece comprises a mask layer on a substrate, as described in further detail below with respect to FIG. 9. The workpiece can comprise a mask on a semiconductor wafer, or can be other workpiece known to one of ordinary skill in the art of electronic device manufacturing. In at least some embodiments, the workpiece comprises any material to make any of integrated circuits, passive (e.g., capacitors, inductors) and active (e.g., transistors, photo detectors, lasers, diodes) microelectronic devices.

The workpiece may include insulating (e.g., dielectric) materials that separate such active and passive microelectronic devices from a conducting layer or layers that are formed on top of them. In one embodiment, the workpiece comprises a mask over a semiconductor substrate that includes one or more dielectric layers e.g., silicon dioxide, silicon nitride, sapphire, and other dielectric materials. In one embodiment, the workpiece comprises a mask over a wafer stack including one or more layers. The one or more layers of the workpiece can include conducting, semiconducting, insulating, or any combination thereof layers.

System 600 comprises an inlet to input one or more process gases 612 through a mass flow controller 611 to a plasma source 613. A plasma source 613 comprising a shower nozzle 614 is coupled to the processing chamber 601 to receive one or more gases 612 and to generate a plasma 615 from the gases. In an embodiment, shower nozzle 614 represents one of the shower nozzles described above with respect to FIGS. 1-5. Shower nozzle 614 is located over workpiece 603.

In an embodiment, nozzle 614 comprises an inlet portion and an outlet portion coupled to the inlet portion, as described above. The inlet portion has a side surface substantially parallel to a vertical Y axis 612. The one or more gases are supplied through a plurality of gas channels of the inlet portion of the nozzle 614 to a plurality of outlets of the outlet portion of the nozzle 614 for uniform distribution over workpiece 603. In an embodiment, at least one of the gas outlets of the nozzle 614 is at an angle other than a right angle relative to the vertical axis, as described above.

Plasma source 613 is coupled to a RF source power 610. Plasma source 613 through shower nozzle 614 generates a plasma 615 in processing chamber 601 from one or more process gases 612 using a high frequency electric field. Plasma 615 comprises plasma particles, such as ions, electrons, radicals, or any combination thereof. In an embodiment, power source 610 supplies power from about 0 W to about 7500 W at a frequency of 13.56 MHz to generate plasma 115. A plasma bias power 605 is coupled to the pedestal 602 (e.g., cathode) via a RF match 607 to energize the plasma.

In an embodiment, the plasma bias power 605 provides a bias power that is not greater than 3000 W at a frequency of 400 KHz. In an embodiment, a plasma bias power 606 may also be provided, for example to provide another bias power that is not greater than 1000 W at a frequency from about 2 MHz to about 60 MHz. In an embodiment, plasma bias power 606 and bias power 605 are connected to RF match 607 to provide a dual frequency bias power. In an embodiment, a total bias power applied to the pedestal 602 is from about 10 W to about 3000 W.

As shown in FIG. 6, a pressure control system 609 provides a pressure to processing chamber 601. As shown in FIG. 6, chamber 601 is evacuated via one or more exhaust outlets 616 to evacuate volatile products produced during processing in the chamber. In an embodiment, the plasma system 600 is an inductively coupled plasma ("ICP") system. In an embodiment, the plasma system 600 is a capacitively coupled plasma ("CCP") system.

A control system 617 is coupled to the chamber 601. The control system 617 comprises a processor 618, a temperature controller 619 coupled to the processor 618, a memory 620 coupled to the processor 618, and input/output devices 621 coupled to the processor 618. In an embodiment, processor 618 has a configuration to control supplying one or more gases through nozzle 614 to generate plasma particles and uniformly distribute the plasma particles over workpiece 603.

In an embodiment, processor 618 has a configuration to control etching of a substrate of the workpiece using the plasma particles, as described in further detail below with respect to FIG. 9. In an embodiment, processor 618 has a configuration to control depositing one or more layers are deposited on the substrate using the plasma particles, as described in further detail below with respect to FIG. 9.

In an embodiment, memory 620 stores one or more parameters comprising at least one of a pressure, a source power, a bias power, a gas flow, or a temperature to control deposition of the one or more layer on the substrate, and to control etching of the substrate, as described in further detail below. The control system 617 is configured to perform methods as described herein and may be either software or hardware or a combination of both.

The plasma system 600 may be any type of high performance semiconductor processing plasma systems known in the art, such as but not limited to an etcher, a cleaner, a furnace, or any other plasma system to manufacture electronic devices. In an embodiment, the system 600 may represent one of the plasma systems, e.g., an Etch Silva Chamber system manufactured by Applied Materials, Inc. located in Santa Clara, Calif., or any other plasma system.

Figure 7:
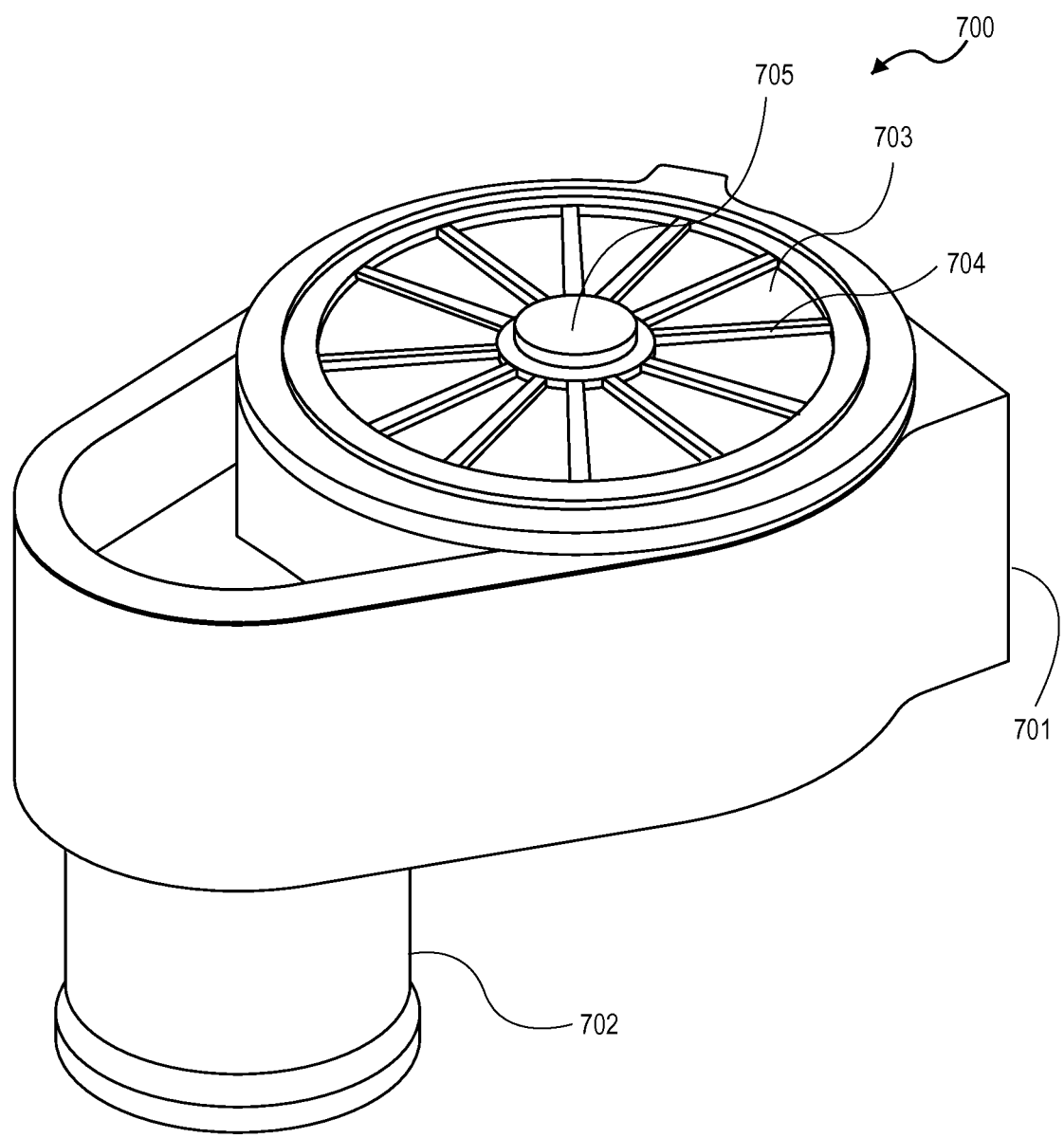
FIG. 7 is a three dimensional view of a plasma processing chamber according to one embodiment of the invention.

FIG. 7 is a three dimensional view of a plasma processing chamber 700 according to one embodiment of the invention. A plasma processing chamber 700 comprises a chamber body 701 where an ESC to hold a workpiece is placed. A lid 703 is placed on the chamber body 701. In an embodiment, lid 703 is made of an insulating material, e.g., ceramic or other insulating material. Heating pads 704 are on the lid 703. A clamp 705 is used to clamp the shower nozzle as described above (not shown) to the lid 705 to place over the workpiece (not shown) in the chamber body 701. The shower nozzle to enhance uniformity of plasma processing as described above is easily assembled and installed onto the feed hub and window pocket on the chamber lid 703. The chamber 700 comprises an exhaust outlet 702 attached to the chamber body 701 to evacuate volatile products and maintain vacuum in the chamber.

Figure 8:
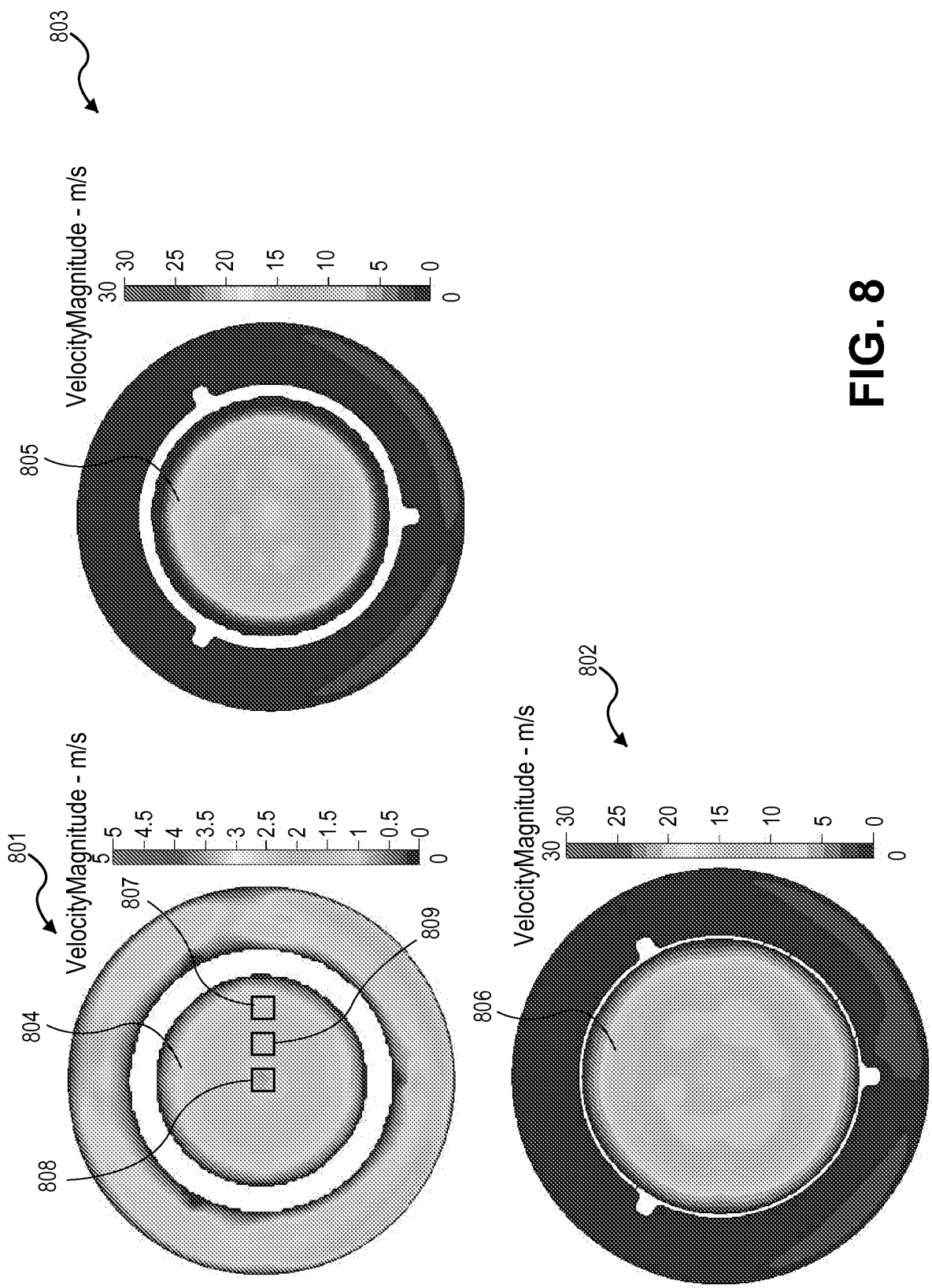
FIG. 8 illustrates velocity distributions of the gas flow through a nozzle above a wafer placed in a plasma chamber according to one embodiment of the invention.

FIG. 8 illustrates velocity distributions of the gas flow through a nozzle above a wafer placed in a plasma chamber according to one embodiment of the invention. A map 801 shows a distribution of the gas flow velocity at a distance of 1 millimeter (mm) above the wafer. A map 802 shows a distribution of the gas flow velocity at a distance of 10 mm above the wafer. A map 803 shows a distribution of the gas flow velocity at a distance of 5 mm above the wafer. In an embodiment, a CFD modeling technique is used to analyze the velocity of gas flow distribution above the wafer in the plasma process chamber. In an embodiment, the gas supplied from the nozzle comprises SF6. C4F8, or any combination thereof. In an embodiment, the flow rate of SF6 gas is about 400 standard cubic centimeters per minute (sccm). In an embodiment, the flow rate of C4F8 gas is about 400 sccm.

In an embodiment, pressure in the plasma chamber is about 140 mTorr. In an embodiment, a gas temperature supplied from plasma source through the nozzle is about 95° C. In an embodiment, temperature of the cathode of the ESC placed in the plasma chamber is about −10 (2. In an embodiment, temperature of the lid (e.g., lid 703) is about 90° C. The plasma chamber can be any of the plasma chambers described above. The nozzle can be any of the nozzles described above. In an embodiment, a gas is supplied from the nozzle as depicted in FIG. 5.

As shown in maps 801, 802, and 803, the gas flow velocity at a distance of 10 mm, 5 mm and 1 mm above the wafer is maintained substantially uniform. As shown in map 801, above a center portion 808, a middle portion 809, and an edge portion 807 the velocity is maintained at about 1.6 m/s that indicates substantial uniformity of the gas flow distribution. The gas flow velocity above the wafer for the existing nozzle designs varies by at least a factor of 6, as shown in FIG. 10 (curve 1005).

Generally, a gas dead zone refers to the volume of gas which does not take part in the gas circulation. In an embodiment, the gas flow supplied through any of the nozzles as described with respect to FIGS. 1-5 flows down to the wafer freely and does not exhibit the dead zones. In an embodiment, the gas flow supplied through any of the nozzles as described with respect to FIGS. 1-5 comprises recirculation zones at a distance about of 1 mm above the wafer to improve the uniformity of the gas flow.

That is, uniformity of gas distribution at a distance about of 1 mm above the center of the wafer with the shower nozzle designs as described with respect to FIGS. 1-5 is significantly improved comparing with existing nozzle designs.

Figure 10:
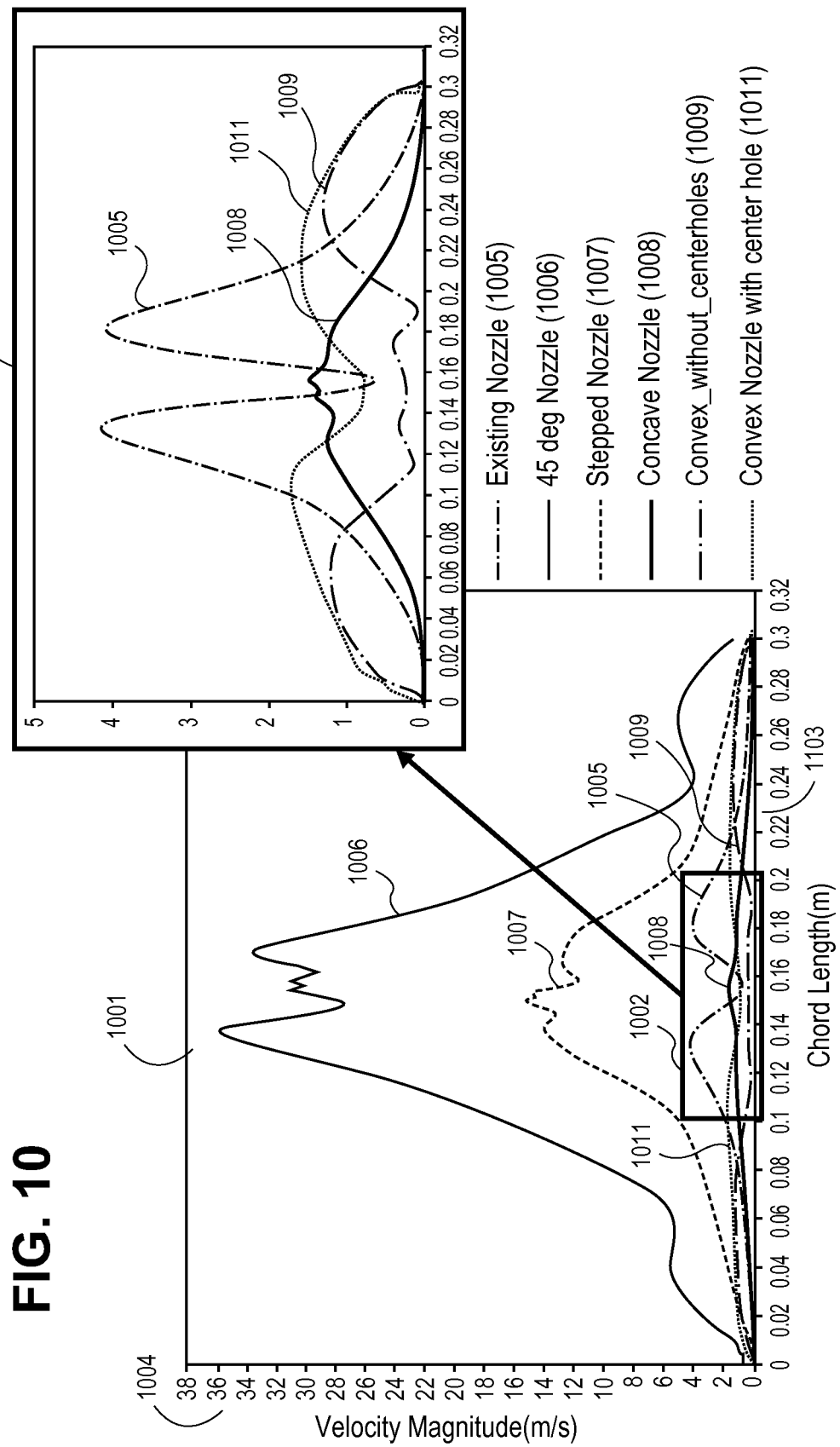
FIG. 10 shows gas velocity plot for various nozzle designs according to one embodiment of the invention.

FIG. 10 shows gas velocity plot for various nozzle designs according to one embodiment of the invention. A plot 1001 shows a velocity magnitude 1004 versus a chord length 1003 at a distance about 1 mm above a wafer for different nozzle designs. A plot 1002 represents a portion of the plot 1001. A curve 1005 shows the gas velocity magnitude for an existing nozzle. A curve 1006 shows the gas velocity magnitude for a nozzle as depicted in FIG. 1. A curve 1007 shows the gas velocity magnitude for a stepped nozzle as depicted in FIG. 2. A curve 1008 shows the gas velocity magnitude for a concave nozzle as depicted in FIG. 3. A curve 1009 shows the gas velocity magnitude for a convex nozzle as depicted in FIG. 4. A curve 1011 shows the gas velocity magnitude for a convex nozzle as depicted in FIG. 5. As shown in FIG. 10, the variation in the gas velocity magnitude is significantly improved comparing with the existing nozzle design. As shown in FIG. 10, the variation in the gas velocity magnitude is decreased from about 6 for the existing design (curve 1005) down to about 1.5 for the design as described in FIG. 5 (curve 1011).

In an embodiment, a shower nozzle as described above with respect to FIGS. 1-5 is used to provide uniform plasma distribution over a wafer for a Bosch process, a backside via reveal etch, or other deposition and etching operations, as described in further detail below.

FIG. 9 shows a side view of an electronic device structure 900 according to one embodiment. Electronic device structure 900 comprises a substrate. In an embodiment, electronic device structure 900 represents workpiece 603 depicted in FIG. 6. In an embodiment, substrate 901 includes a semiconductor material, e.g., monocrystalline silicon ("Si"), germanium ("Ge"), silicon germanium ("SiGe"), a III-V materials based material e.g., gallium arsenide ("GaAs"), or any combination thereof. In one embodiment, substrate 901 includes metallization interconnect layers for integrated circuits. In one embodiment, substrate 901 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, substrate 901 includes interconnects, for example, vias, configured to connect the metallization layers. In one embodiment, substrate 901 is a semiconductor-on-isolator (SOI) substrate including a bulk lower substrate, a middle insulation layer, and a top monocrystalline layer. The top monocrystalline layer may comprise any material listed above, e.g., silicon.

A device layer 902 is deposited on substrate 901. In an embodiment, device layer 902 comprises an insulating layer suitable to insulate adjacent devices and prevent leakage. In one embodiment, device layer 902 comprises an oxide layer. e.g., silicon oxide, aluminum oxide ("Al$_2$O$_3$"), silicon oxide nitride ("SiON"), a silicon nitride layer, any combination thereof, or other electrically insulating layer determined by an electronic device design. In one embodiment, a device layer 902 comprises an interlayer dielectric (ILD). e.g., silicon dioxide. In one embodiment, device layer 902 includes polyimide, epoxy, photodefinable materials, such as benzocyclobutene (BCB), and WPR-series materials, or spin-on-glass.

In an embodiment, device layer 902 comprises a conductive layer. In an embodiment, device layer 902 comprises a metal, for example, copper (Cu), aluminum (Al), indium (In), tin (Sn), lead (Pb), silver (Ag), antimony (Sb), bismuth (Bi), zinc (Zn), cadmium (Cd), gold (Au), ruthenium (Ru), nickel (Ni), cobalt (Co), chromium (Cr), iron (Fe), manganese (Mn), titanium (Ti), hafnium (Hf), tantalum (Ta), tungsten (W), vanadium (V), molybdenum (Mo), palladium (Pd), gold (Au), platinum (Pt), polysilicon, other conductive layer known to one of ordinary skill in the art of electronic device manufacturing, or any combination thereof. In an embodiment, device layer 902 is a stack of one or more layers described above.

Device layer 902 can be deposited using one of a deposition techniques, such as but not limited to a chemical vapour deposition ("CVD"), e.g., a Plasma Enhanced Chemical Vapour Deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

In an embodiment, the thickness of the device layer 902 is from about 2 nanometers ("nm") to about 5 micron (μm"). A patterned mask 903 is deposited on a device layer 902. In an embodiment, mask 903 is a hard mask, for example, an oxide mask, a resist mask, an amorphous carbon layer (ACL) mask, or any other mask to etch the underlying device layer 902. In an embodiment, mask 903 is a boron doped amorphous carbon layer (BACL), as manufactured by Applied Materials, Inc. located in Santa Clara, Calif., or other BACL. In an embodiment, the thickness of the mask layer 903 is from about 2 nm to about 5 μm. The patterned mask 903 can be formed using the deposition and patterning techniques known to one of ordinary skill in the art of electronic device manufacturing.

Figure 9A:
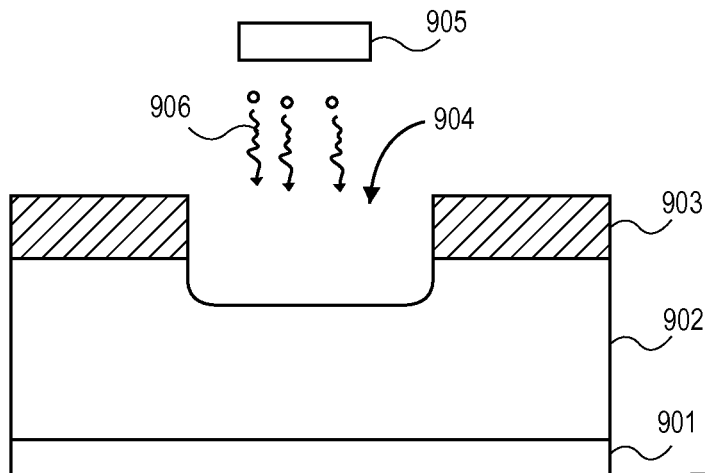
FIG. 9A shows a side view of an electronic device structure according to one embodiment of the invention.

As shown in FIG. 9A, a gas is supplied through a nozzle 905 to a processing chamber to generate plasma particles 906 to etch a portion of the device layer 902 exposed by the mask 903 to form an opening 904. Plasma particles 906 comprise ions, electrons, radicals, or any combination thereof. In an embodiment, the nozzle 905 represents one of the nozzles described above with respect to FIGS. 1-5. The plasma chamber can be one of the plasma chambers described above, or other plasma chamber. In an embodiment, the gas to generate plasma particles 906 comprises SF6, CF4, O2, or any combination thereof. In an embodiment, the depth of the etched opening 904 is from about 10 nm to about 300 nm.

Figure 9B:
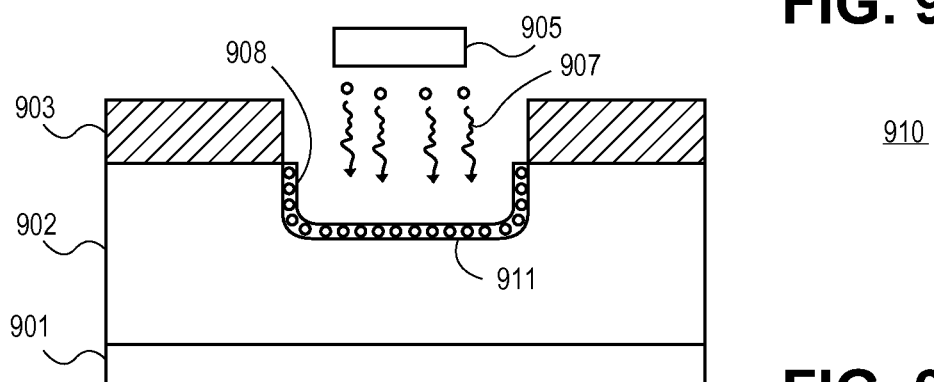
FIG. 9B is a view 910 similar to FIG. 9A illustrating depositing a passivation layer 908 in the opening 904 according to one embodiment of the invention.

FIG. 9B is a view 910 similar to FIG. 9A illustrating depositing a passivation layer 908 in the opening 904 according to one embodiment. A passivation layer 908 is deposited using plasma particles 907. Plasma particles 907 comprise ions, electrons, radicals, or any combination thereof. A gas is supplied through the nozzle 905 to generate plasma particles 907. Passivation layer 908 is deposited by chemically bonding plasma particles 907 to the sidewalls and a bottom 911 of the opening 904. The passivation layer 908 protects the sidewalls of the opening 904 substrate from further etching. In an embodiment, the gas to generate plasma particles 907 comprises (CFx)n, SiFx, C4F8, C4F6, CHF3, SiF4, or any combination thereof. In an embodiment, passivation layer 907 is a fluorocarbon ((CFx)n) layer. In an embodiment, the thickness of the passivation layer 907 is from about 1 nm to about 100 nm.

Figure 9C:
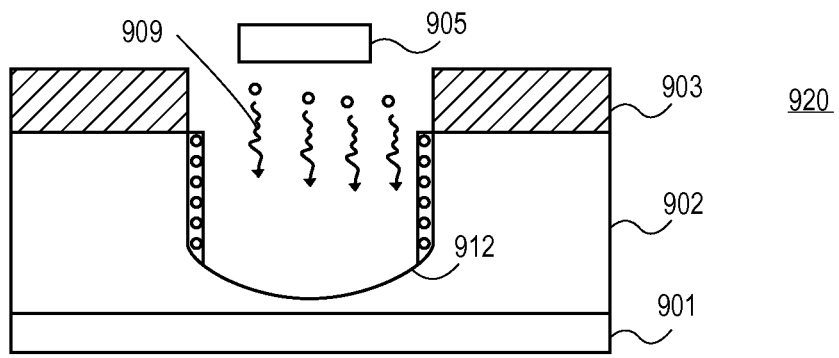
FIG. 9C is a view 920 similar to FIG. 9B illustrating etching a portion of the device layer through the passivated layer on the bottom of the opening 904 according to one embodiment of the invention.

FIG. 9C is a view 920 similar to FIG. 9B illustrating etching a portion of the device layer through the passivated layer on the bottom of the opening 904 according to one embodiment of the invention. During the etching operation, the directional plasma particles, such as ions, electrons, radicals, or any combination thereof that bombard the device layer attack the passivation layer at the bottom 911 of the opening 904 while preserving passivation layer 907 on the sidewalls of the opening 904. The plasma particles 909 collide with passivation layer 907 exposing the bottom portion 912 of the opening. In an embodiment, the exposed portion 912 is etched down to the depth from about 10 nm to about 300 nm.

Figure 9D:
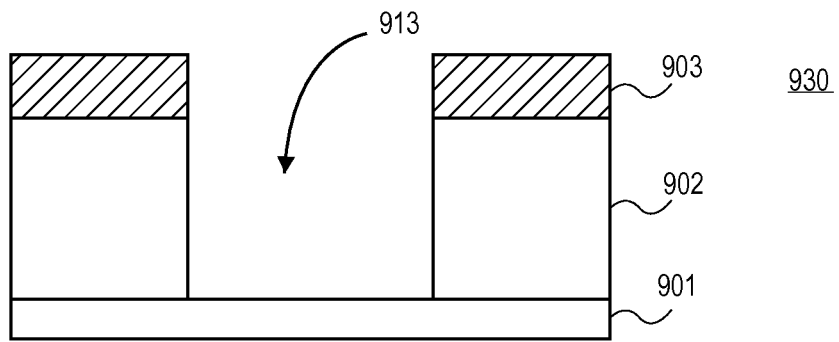
FIG. 9D is a view 930 after etching and deposition operations as described in FIGS. 9B and 9C are repeated many times according to one embodiment of the invention.

FIG. 9D is a view 930 after etching and deposition operations as described in FIGS. 9B and 9C are repeated many times according to one embodiment of the invention. The etching and deposition operations as described in FIGS. 9B and 9C are repeated to incrementally etch the bottom of the opening down to the substrate 902 while preserving its sidewalls to form an opening 913. In an embodiment, the depth of the opening 913 is from about few angstroms (Å) to about hundreds of microns.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. An apparatus for uniform plasma processing comprising:
   a nozzle comprising:
      an inlet portion comprising a plurality of gas channels, the inlet portion having a side surface substantially parallel to a vertical axis;
      a cavity below the plurality of gas channels; and
      an outlet portion below the cavity, wherein the outlet portion comprises a plurality of outlets, wherein at least one of the outlets is at an angle other than a right angle relative to the vertical axis, and wherein the outlet portion has a concave shape; and
   a support feature in the cavity between the inlet portion and the outlet portion.

2. The apparatus of claim 1, wherein at least one of the gas channels extends at an angle relative to the vertical axis.

3. The apparatus of claim 1, wherein the number of outlets is greater than the number of gas channels.

4. The apparatus of claim 1, wherein the outlet portion comprises at least one step.

5. The apparatus of claim 1, wherein the outlet portion comprises a side surface that extends at an angle to the vertical axis.

6. A plasma processing system comprising:
   a processing chamber comprising a pedestal to hold a workpiece comprising a substrate;
   a plasma source;
   a nozzle coupled to the plasma source to receive a gas to generate plasma in the processing chamber, wherein the nozzle comprises an inlet portion comprising a plurality of gas channels, the inlet portion comprises a side surface substantially parallel to a vertical axis, a cavity below the plurality of gas channels;

an outlet portion below the cavity, the outlet portion comprising a plurality of outlets, wherein at least one of the outlets is at an angle other than a right angle relative to the vertical axis, and wherein the outlet portion has a concave shape; and a support feature in the cavity between the inlet portion and the outlet portion.

7. The system of claim 6, wherein at least one of the gas channels extends at an angle relative to the vertical axis.

8. The system of claim 6, wherein the number of outlets is greater than the number of gas channels.

9. The system of claim 6, wherein the outlet portion comprises at least one step.

10. The system of claim 6, wherein the outlet portion comprises a side surface that extends at an angle to the vertical axis.

* * * * *